United States Patent
Weinert et al.

(10) Patent No.: US 7,256,425 B2
(45) Date of Patent: Aug. 14, 2007

(54) METHODS OF PRODUCING PLANE-PARALLEL STRUCTURES OF SILICON SUBOXIDE, SILICON DIOXIDE AND/OR SILICON CARBIDE, PLANE-PARALLEL STRUCTURES OBTAINABLE BY SUCH METHODS, AND THE USE THEREOF

(75) Inventors: Hilmar Weinert, Kaufbeuren (DE); Patrice Bujard, Reinach (CH); Rüdiger Hainz, Binzen (DE)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 374 days.

(21) Appl. No.: 10/504,412

(22) PCT Filed: Feb. 11, 2003

(86) PCT No.: PCT/EP03/01323

§ 371 (c)(1),
(2), (4) Date: Aug. 9, 2004

(87) PCT Pub. No.: WO03/068868

PCT Pub. Date: Aug. 21, 2003

(65) Prior Publication Data

US 2005/0161678 A1    Jul. 28, 2005

(30) Foreign Application Priority Data

Feb. 18, 2002 (DE) ............................. 102 06 820
Mar. 12, 2002 (DE) ............................. 102 10 743
Jun. 18, 2002 (DE) ............................. 102 27 229
Jul. 25, 2002 (EP) ............................. 02405649

(51) Int. Cl.
H01L 25/15 (2006.01)
H01L 31/0312 (2006.01)

(52) U.S. Cl. ............... 257/77; 106/400; 427/249.15; 427/255.7

(58) Field of Classification Search ........... 427/249.15, 427/255.7, 255.5, 336, 337, 251; 257/77; 264/81
See application file for complete search history.

(56) References Cited

U.S. PATENT DOCUMENTS

| | | | |
|---|---|---|---|
| 5,356,471 A | 10/1994 | Reynders | ........... 106/489 |
| 5,766,335 A * | 6/1998 | Bujard et al. | ........... 106/404 |
| 6,270,840 B1 | 8/2001 | Weinert | ........... 427/251 |
| 2003/0075079 A1 | 4/2003 | Sommer | ........... 106/442 |
| 2004/0131776 A1 | 7/2004 | Weinert | ........... 427/255.7 |

FOREIGN PATENT DOCUMENTS

| | | |
|---|---|---|
| CA | 2366953 | 10/2000 |
| DE | 3626660 | 2/1988 |
| DE | 4227082 | 2/1994 |
| EP | 0803549 | 10/1997 |
| WO | 00/43565 | 7/2000 |
| WO | 00/69975 | 11/2000 |
| WO | 01/25500 | 4/2001 |
| WO | WO0294945 A1 * | 5/2001 |
| WO | 02/10290 | 2/2002 |

OTHER PUBLICATIONS

English Language Abstract for DE 3626660 (1988).
Ullmanns Encyklopädie der Technischen Chemie, vol. 21, pp. 466-467.
Roempp Lexikon Online [Nov. 12, 2002], Gefriertrocknung.
Ciba Specialty Chemicals Corp. U.S. Appl. No. 10/870,643, filed Jun. 10, 2004.
Ciba Specialty Chemicals Corp. U.S. Appl. No. 10/870,644, filed Jun. 10, 2004.

* cited by examiner

Primary Examiner—J. A. Lorengo
Assistant Examiner—Pegah Parvini
(74) Attorney, Agent, or Firm—Joseph C. Suhadolnik

(57) ABSTRACT

A product produced in a PVD method is described, which consists of thin plane-parallel structures having a thickness in the range from 20 to 2000 nm and small dimensions in the range below one mm. Production is carried out by condensation of silicon suboxide onto a carrier passing by way of the vaporisers. The carrier is pre-coated, before condensation of the silicon suboxide, with a soluble, inorganic or organic separating agent in a PVD method. All steps, including that of detaching the product by dissolution, can be carried out continuously and simultaneously at different locations. As final step, the $SiO_y$ may be oxidised to $SiO_2$ in an oxygen-containing gas at atmospheric pressure and temperatures of more than 200° C. or $SiO_y$ may be converted to SiC at the surface of the plane-parallel structures in a carbon-containing gas at from 500° C. to 1500° C. The products produced in that manner are distinguished by high uniformity of thickness.

37 Claims, No Drawings

METHODS OF PRODUCING PLANE-PARALLEL STRUCTURES OF SILICON SUBOXIDE, SILICON DIOXIDE AND/OR SILICON CARBIDE, PLANE-PARALLEL STRUCTURES OBTAINABLE BY SUCH METHODS, AND THE USE THEREOF

The present invention relates to methods of producing plane-parallel structures of silicon suboxide, silicon dioxide and/or silicon carbide, to plane-parallel structures obtainable by such methods, and to the use thereof.

Silicon suboxide ($SiO_x$) is understood to mean combinations or compounds of silicon with oxygen wherein the oxygen content is not sufficient for complete oxidation of the silicon. In the context of the present patent application, the expression silicon suboxide is intended also to encompass silicon monoxide (that is to say, SiO or $SiO_y$ wherein y=1).

Plane-parallel structures of silicon dioxide are used as catalyst supports, it being possible to obtain a large active surface area of catalyst material to be applied chemically in accordance with known methods, whilst it has a low weight per unit area of typically from 0.1 to 1.0 $g/m^2$. Further applications of such plane-parallel structures are to be found in the field of the surface coating industry, wherein it is desired to incorporate colourless structures that have, as far as possible, the same refractive index as the surface coating, in order to achieve an improvement in the resistance to abrasion of the surface coating layers. Further applications are low-ohm conductive surface coatings, in which case the plane-parallel structures are subjected to further coating with metals of high conductivity. They are also suitable as supports for further coatings.

The direct vapour-deposition of silicon dioxide onto surfaces by the PVD method is known. For that purpose, in almost all cases, vaporisation by means of an electron beam from water-cooled copper crucibles is used in order to avoid a chemical reaction of the liquid silicon dioxide with crucible material at the required vaporisation temperatures of from 1700 to 1900° C. Examples thereof are to be found in U.S. Pat. No. 5,792,550, in the form of a double layer of aluminium oxide and silicon oxide for improving packaging film barrier properties, and also in U.S. Pat. No. 3,438,796. According to the latter specification, coloured structures comprising a layered composite of aluminium and $SiO_2$ are produced by direct vaporisation of $SiO_2$, the $SiO_2$ layers, according to Examples II and III therein, being located as a protective layer on the air-interface surface. U.S. Pat. No. 6,150,022 also describes $SiO_2$ protective layers on both sides of aluminium, the three-layer composite subsequently being detached by dissolution and broken up into small flakes. These are used in printing inks and surface coatings having a high reflecting power.

Transparent glass particles are sometimes used as an additive which is admixed with surface coatings in order to increase their surface hardness and resistance to abrasion. In accordance with U.S. Pat. No. 4,985,380, a glass is obtained in molten form from a melted mixture of silicon dioxide, boron oxide and aluminium oxide. According to one method, which according to the patent specification is similar to that of producing soap bubbles, thin-walled spheres of from 1 to 5 cm in diameter are blown therefrom. The spheres are then cooled, broken up and ground and used as an additive in surface coatings. The laborious manner of production and the uneven wall thickness of the resulting glass particles of about 2 μm restrict such use.

U.S. Pat. No. 6,342,272 claims the use of powders comprising silicon dioxide, glass, mica and other materials as a protective layer which is incorporated in synthetic resin coatings by thermal spraying. The method requires two layers of polymer and one layer of the inorganic materials mentioned. It is not suitable for use over large areas.

The product ORMOCER®, produced by the known sol-gel method, consists of inorganic-organic hybrid polymers which, according to information from Fraunhofer Silicafforschung, are also suitable for increasing the resistance to abrasion of surface coatings. They do not, however, form plane-parallel, purely inorganic structures but rather produce a network of silicon alkoxides. The production process is discontinuous, and the thickness of the particles cannot be controlled.

A similar process according to U.S. Pat. No. 5,312,701 produces plane-parallel, ceramic structures in a wet method by means of the solidification of a sol-gel consisting of boehmite, TEOS (an organic silicon compound), boric acid and α-aluminium oxide. $SiO_2$-containing plane-parallel structures having a thickness in the range from 1 to 15 μm are formed. Reference is made to their use as a filler for abrasion-resistant surface coatings. The method is lengthy. According to Example 8, stirring must be carried out for 3 days, followed by freeze-drying and three hours of stoving at 1300° C. The process does not allow the thickness to be controlled precisely and it is not a continuous process.

In accordance with U.S. Pat. No. 3,123,489 and U.S. Pat. No. 4,168,986, it is furthermore known that plane-parallel structures of small dimensions can be produced by vapour-depositing first a salt layer onto a carrier and, in the same vacuum, a product layer directly on top. When the carrier is later brought into contact with water, the salt layer underneath the product layer dissolves, the latter layer breaking up into small plane-parallel structures. By further processing the resulting suspension, the plane-parallel structures can be isolated. In that method it is important that the plane-parallel structures themselves are not soluble in the solvent used.

Instead of salts, organic substances can also be vaporised. When they are dissolved in an organic solvent, the product layer on top of them breaks up into small, plane-parallel structures. Examples thereof include WO 00/62943 and U.S. Pat. No. 5,811,183. Such substances are melamines, triazines, siliconised or fluorinated acrylic monomers. Similar organic monomers are described in U.S. Pat. No. 5,811,183 as a separating agent layer capable of being vapour-deposited.

DE 4342574 and U.S. Pat. No. 5,239,611 describe the vaporisation of silicon monoxide in order to obtain barrier coatings on plastics films, as does W. Nassel: "Production, Properties, Processing and Application of SiO-coated Films" (Proceedings of $7^{th}$ International Conference on Vacuum Web Coating" (ISBN 0-939997-15-0)). Silicon monoxide has the advantage that it does not react, or reacts only slightly, with crucible material of high-temperature metals, it is already vaporised at 1450° C. in vacuo in large amounts per unit time, and it is very readily vaporised from resistance-heated sources. However, the intrinsic colour of such layers is the brownish-yellow colour typical of SiO, which is undesirable for many applications. The mechanical strength is lower than that of $SiO_2$.

A further method of producing plane-parallel $SiO_2$ structures, which does not require a PVD process, is described in EP 0 608 388 B1. A liquid film of waterglass is applied to an endless plastics belt, dried, treated with acid, dried again, mechanically separated from the belt, washed, and then baked. It is disadvantageous in that method that, in contrast to the invention described hereinbelow, the layer thickness of product cannot, as it is in the case of the PVD method, be exactly controlled to a few nanometres. Furthermore, measures are required against the acid vapours that form, and the plastics belt must be replaced relatively frequently because its surface becomes worn in the process.

It is likewise known from the prior art that vapour-deposited SiO layers can be entirely converted to $SiO_2$ by heating in air at above 400° C. Such oxidative conversion is possible in the case of coated articles such as glass or ceramics, but not in the case of plastics.

A solution thereto is the generally known reactive vaporisation of SiO at about $10^{-2}$ Pa with the simultaneous admission of oxygen into the vaporisation chamber. However, that is possible only with extremely slow vaporisation rates of a few milligrams per second, which are too low to produce plane-parallel structures of $SiO_2$ on an industrial scale.

Calculation shows that, in the case of reactive vaporisation, oxidation of one mol of SiO to $SiO_2$ requires the introduction of at least 16 g of oxygen (=½ mol), which corresponds to an amount of $11.2 \times 10^7$ litres of gas at $10^{-2}$ Pa. With a vaporisation rate of at least 2.2 g of SiO (0.05 mol) per second being necessary for the indicated purpose in order for it to be viable, that corresponds to the admission of at least 5.6 million litres of oxygen gas per second at $10^{-2}$ Pa. Because not every molecule of oxygen will react with a molecule of SiO, the excess of oxygen would have to be pumped off continuously. That exceeds the technical possibilities of even the largest PVD installations.

Because, for practical reasons, oxidation for the purpose of producing transparent, colourless, plane-parallel $SiO_2$ structures cannot be carried out by thermal oxidation on the carrier itself or by reactive vaporisation of silicon suboxide in the presence of oxygen, according to the invention thermal oxidation is postponed, as explained in detail hereinafter, until a later stage which is not dependent upon the technically possible vapour-deposition rate.

Setiowati and Kimura in "Silicon Carbide Powder Synthesis from Silicon Monoxide and Methane" (Journal of the American Ceramic Soc., Vol. 80 (3) 1997, p. 757-760) describe the production of nano-powders and so-called whiskers of SiC from the reaction gases SiO and $CH_4$ at temperatures of from 1400 to 1600° C. According to U.S. Pat. No. 5,618,510, carbon fibres are entirely converted into SiC fibres by reaction with SiO vapour at from 800 to 2000° C.

Neither method is suitable, however, for converting plane-parallel structures of SiO, starting from their surfaces, at least partially into silicon carbide.

The problem of the invention is to provide methods of producing plane-parallel structures of silicon suboxide, silicon dioxide and/or silicon carbide resulting in plane-parallel structures having thicknesses of from 20 to 2000 nm and length and width dimensions of less than 0.2 mm, in industrial amounts, and with low outlay in terms of equipment and also with good constancy of thickness.

The problem is solved by a method of producing plane-parallel structures of $SiO_y$, wherein $0.95 \leq y \leq 1.8$, preferably wherein $1.1 \leq y \leq 1.8$, especially wherein $1.4 \leq y \leq 1.8$, comprising the steps:
a) vapour-deposition of a separating agent onto a movable carrier to produce a separating agent layer,
b) vapour-deposition of an $SiO_y$ layer onto the separating agent layer,
c) dissolution of the separating agent layer in a solvent,
d) separation of the $SiO_y$ from the solvent, the $SiO_y$ layer in step b) being vapour-deposited from a vaporiser containing a charge comprising a mixture of Si and $SiO_2$, $SiO_y$ or a mixture thereof, the weight ratio of Si to $SiO_2$ being preferably in the range from 0.15:1 to 0.75:1, and especially containing a stoichiometric mixture of Si and $SiO_2$, and step c) being carried out at a pressure that is higher than the pressure in steps a) and b) and lower than atmospheric pressure, and wherein plane-parallel structures of $SiO_y$ obtainable by this method have a thickness in the range preferably from 20 to 2000 nm, especially from 100 to 350 nm, the ratio of the thickness to the surface area of the plane-parallel structures being preferably less than 0.01 $\mu m^{-1}$. The plane-parallel structures thereby produced are distinguished by high uniformity of thickness.

The term "$SiO_y$ with $0.95 \leq y \leq 1.80$" means that the molar ratio of oxygen to silicon at the average value of the silicon oxide layer is from 0.95 to 1.80. Accordingly, the term "$SiO_z$ with $1.0 \leq y \leq 2.0$" means that the molar ratio of oxygen to silicon at the average value of the silicon oxide layer is from 1.0 to 2.0. The composition of the silicon oxide layer can be determined by ESCA (electron spectroscopy for chemical analysis).

The $SiO_y$ layer in step b) is formed preferably from silicon monoxide vapour produced in the vaporiser by reaction of a mixture of Si and $SiO_2$ at temperatures of more than 1300° C.

The vapour-deposition in steps a) and b) is carried out preferably under a vacuum of <0.5 Pa. The dissolution of the separating agent layer in step c) is carried out at a pressure in the range preferably from 1 to $5 \times 10^4$ Pa, especially from 600 to $10^4$ Pa, and more especially from $10^3$ to $5 \times 10^3$ Pa.

The separating agent vapour-deposited onto the carrier in step a) may be a lacquer (surface coating), a polymer, such as, for example, the (thermoplastic) polymers, in particular acryl- or styrene polymers or mixtures thereof, as described in U.S. Pat. No. 6,398,999, an organic substance soluble in organic solvents or water and vaporisable in vacuo, such as anthracene, anthraquinone, acetamidophenol, acetylsalicylic acid, camphoric anhydride, benzimidazole, benzene-1,2,4-tricarboxylic acid, biphenyl-2,2-dicarboxylic acid, bis(4-hydroxyphenyl)sulfone, dihydroxyanthraquinone, hydantoin, 3-hydroxybenzoic acid, 8-hydroxyquinoline-5-sulfonic acid monohydrate, 4-hydroxycoumarin, 7-hydroxycoumarin, 3-hydroxynaphthalene-2-carboxylic acid, isophthalic acid, 4,4-methylene-bis-3-hydroxynaphthalene-2-carboxylic acid, naphthalene-1,8-dicarboxylic anhydride, phthalimide and its potassium salt, phenolphthalein, phenothiazine, saccharin and its salts, tetraphenylmethane, triphenylene, triphenylmethanol or a mixture of at least two of those substances. The separating agent is preferably an inorganic salt soluble in water and vaporisable in vacuo (see, for example, DE 19844357), such as sodium chloride, potassium chloride, lithium chloride, sodium fluoride, potassium fluoride, lithium fluoride, calcium fluoride, sodium aluminium fluoride and disodium tetraborate.

The movable carrier may consist of one or more discs, cylinders or other rotationally symmetrical bodies, which rotate about an axis (cf. WO01/25500), and consists preferably of one or more continuous metal belts with or without a polymeric coating or of one or more polyimide or polyethylene terephthalate belts (DE19844357).

A plurality of separating agent and $SiO_y$ layers may preferably be vapour-deposited in alternating sequence, one after the other, onto the movable carrier in vacuo before they are removed by dissolution in accordance with step c).

Step d) may comprise washing-out and subsequent filtration, sedimentation, centrifugation, decanting and/or evaporation. The plane-parallel structures of $SiO_y$ may, however, also be frozen together with the solvent in step d) and subsequently subjected to a process of freeze-drying, whereupon the solvent is separated off as a result of sublimation below the triple point and the dry $SiO_y$ remains behind in the form of individual plane-parallel structures.

The plane-parallel structures of $SiO_y$ separated off in step d) may be oxidised using an oxygen-containing gas such as, for example, air at a temperature of at least 200° C., especially at above 400° C., preferably in the form of loose material, in a fluidised bed or by introduction into an oxidising flame, preferably at a temperature in the range from 500 to 1000° C., to form plane-parallel structures, and optionally subjected to dipping, spraying or vapour treatment with at least one organic silane compound and/or at least one fluorine-containing organic compound in order to obtain coupling properties with respect to other organic compounds or for the purpose of producing hydrophilic, hydrophobic or antistatic surfaces.

The invention relates also to plane-parallel structures of silicon dioxide that are obtainable by this method and have a thickness preferably in the range from 20 to 2000 nm.

The plane-parallel structures of silicon dioxide or silicon suboxide may be used, for example, in surface coatings or dispersion layers for increasing the abrasion resistance and impact resistance of the surfaces of those surface coatings or dispersions.

Alternatively, the plane-parallel structures of $SiO_y$ separated off in accordance with step d) may, in a further step g), be treated with a carbon-containing gas selected from alkynes, for example acetylene, alkanes, for example methane, alkenes, aromatic compounds and mixtures thereof optionally in admixture with an oxygen containing compound, such as, for example, aldehydes, ketones, water, carbon monoxide, carbon dioxide or the like, or mixtures thereof, at from 500 to 1500° C., preferably from 500 to 1000° C., preferably with the exclusion of oxygen, where appropriate with an inert gas such as, for example, argon or helium being admixed with the carbon-containing gas. Preferably the oxygen-containing compound is contained in an amount of 0.01 to 10 percent by volume based on the volume of carbon-containing gas and oxygen containing gas.

All of the $SiO_y$ may be reacted to form SiC. Preferably from 5 to 90% by weight of the $SiO_y$ are reacted to form SiC in the "carburisation".

The residual amount of $SiO_y$ of the plane-parallel structures carburised in accordance with step g) may, in a further step h), be oxidised using an oxygen-containing gas, for example air, at a temperature of at least about 200° C. up to a maximum of about 400° C.

The plane-parallel structures obtained (carburised) in accordance with steps g) and h), having a preferred thickness in the range from 20 to 2000 nm, are novel and the invention relates also thereto. They may be used, for example, as corrosion-resistant additives having a Mohs hardness of from 8 to 9 in coatings or as corrosion-resistant additives in coating compositions in order to obtain properties of selective reflection in the infra-red.

In accordance with an embodiment of the present invention, a salt, for example NaCl, followed successively by a layer of silicon monoxide (SiO) is vapour-deposited onto a carrier, which may be a continuous metal belt, passing by way of the vaporisers under a vacuum of <0.5 Pa. The thicknesses of salt vapour-deposited are about 30 nm, those of the SiO from 20 to 2000 nm depending upon the intended purpose of the product. It must be borne in mind herein that, as a result of the heat of condensation and the radiant heat of the SiO vaporiser, considerable amounts of heat are transferred to the carrier. In contrast to conventional vapour-deposition of aluminium onto films in the roll-to-roll process, a reflector of infra-red, which as in the case of aluminium reflects about 90% of the impinging heat radiation, is not formed in the case of SiO layers. On the contrary, in the case of a vapour-deposited layer that is substantially transparent, some of the radiant heat is absorbed on its way through a transparent carrier film, it is then reflected at the cooling roller over which the film is running, and some of it is then again absorbed in the film.

Layer thicknesses of more than 100 nm result in substantial heating of the film carrier in the case of SiO vapour-deposition, which results in softening and thermal degradation if the glass transition temperature of the plastics film is exceeded. It has therefore proved advantageous to use a metallic carrier which withstands such loading.

In accordance with the invention it is possible by that means to obtain, without thermally overloading the carrier, belt speeds that allow SiO to be vapour-deposited in large amounts of SiO of several tonnes per month. Values of 10 kg per hour can be obtained when using vaporisers described in DE 4342574 C1 and in U.S. Pat. No. 6,202,591.

Except under an ultra-high vacuum, in technical vacuums of a few $10^{-2}$ Pa vaporised SiO always condenses as $SiO_y$, wherein $1 \leq y < 1.8$, especially wherein $1.1 < y < 1.8$, because high-vacuum apparatuses always contain, as a result of gas emission from surfaces, traces of water vapour which react with the readily reactive SiO at vaporisation temperature.

On its further course, the belt-form carrier, which is closed to form a loop, runs through dynamic vacuum lock chambers of known mode of construction (cf. U.S. Pat. No. 6,270,840) into a region of from 1 to $5 \times 10^4$ Pa pressure, preferably from 600 to $10^4$ Pa pressure, and especially from $10^3$ to $5 \times 10^3$ Pa pressure, where it is immersed in a dissolution bath. The temperature of the solvent should be so selected that its vapour pressure is in the indicated pressure range. With mechanical assistance, the separating agent layer rapidly dissolves and the product layer breaks up into flakes, which are then present in the solvent in the form of a suspension. On its further course, the belt is dried and freed from any contaminants still adhering to it. It runs through a second group of dynamic vacuum lock chambers back into the vaporisation chamber, where the process of coating with separating agent and product layer of SiO is repeated.

The suspension then present in both cases, comprising product structures and solvent, and the separating agent dissolved therein, is then separated in a further operation In accordance with a known technique. For that purpose, the product structures are first concentrated in the liquid and rinsed several times with fresh solvent in order to wash out the dissolved separating agent. The product, in the form of a solid that is still wet, is then separated off by filtration, sedimentation, centrifugation, decanting or evaporation.

Then, after drying, the product can be subjected to oxidative heat treatment. Known methods are available for that purpose. Air or some other oxygen-containing gas is passed through the plane-parallel structures of $SiO_y$ wherein y is, depending on the vapour-deposition conditions, from 1 to about 1.8, which are in the form of loose material or in a fluidised bed, at a temperature of more than 200° C., preferably more than 400° C. and especially from 500 to 1000° C. After several hours all the structures will have been oxidised to $SiO_2$. The product can then be brought to the desired particle size by means of grinding or air-sieving and delivered for further use.

Alternatively thereto, the oxidation may be carried out in a hot oxidising gas stream, that is to say by means of blowing through an oxidative flame and collection in flight. It is also possible, however, to use any other method of oxidative heat treatment according to the known art.

An economically useful side-effect of oxidation is that an increase in weight, which amounts to 36%, occurs on conversion from SiO to $SiO_2$.

In the production of plane-parallel structures of $SiO_2$, variants are possible:

It is possible to arrange several separating agent and product vaporisers one after the other in the running direction of the belt in the vaporisation zone. By that means there is obtained, with little additional outlay in terms of apparatus, a layer sequence of S+P+S+P, wherein S is the separating agent layer and P is the product layer. If the number of vaporisers is doubled and the belt speed is the same, twice the amount of product is obtained.

Separating off the plane-parallel structures after washing-out at atmospheric pressure can be carried out under gentle conditions by freezing the suspension, which has been concentrated to a solids content of about 50%, and subjecting it in known manner to freeze-drying at about –10° C. and 50 Pa pressure. The dry substance remains behind as product, which can be subjected to the steps of further processing by means of coating or chemical conversion.

Instead of using a continuous belt, it is possible to produce the product by carrying out the steps of vapour-deposition of separating agent and SiO, of dissolution, and of drying the carrier, in an apparatus having a rotary body, in accordance with WO01/25500. The rotary body may be one or more discs, a cylinder or any other rotationally symmetrical body.

The method known per se of producing silicon monoxide from silicon and silicon dioxide by means of the reaction

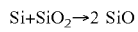

$$Si+SiO_2 \rightarrow 2\ SiO$$

at more than 1300° C., preferably from 1300° C. to 1600° C., in vacuo, is combined in accordance with the invention with the vaporisation of SiO. In vaporisers specifically set up for the purpose, a preferably stoichiometric mixture of fine silicon and quartz powder is heated to, for example, about 1450° C. under a high vacuum. The reaction product is silicon monoxide gas. Instead of collecting the silicon monoxide and grinding it in order for it then to be vaporised at a later stage, the silicon monoxide vapour resulting from the chemical reaction in vacuo is directed directly onto the passing carrier, where it condenses as SiO. Separate production of SiO in a separate step is therefore not necessary. It is also possible to use non-stoichiometric mixtures. However, residues of either $SiO_2$ or Si are left after the reaction. When such non-stoichiometric mixtures having an excess of $SiO_2$ are used, it is advantageous that the excess remaining behind forms a solid protective insulating layer against the wall of the vaporiser source.

In accordance with an embodiment of the invention, plane-parallel structures of silicon dioxide in thicknesses of from 20 to 2000 nm are produced by condensing, under a vacuum of <0.5 Pa, at least one separating agent and silicon suboxide (the latter produced from silicon monoxide vapour formed simultaneously in the same vaporiser by reaction of silicon dioxide and silicon at temperatures of more than 1300° C.), one after the other, onto a movable carrier and, in the following step, removing them from the movable carrier by dissolution of the separating agent, followed by separation from the solvent and, at a temperature of more than 200° C., oxidation in a heated bed in the presence of oxygen to form silicon dioxide.

In accordance with the invention, the vaporiser contains a charge comprising a mixture of Si and $SiO_2$, $SiO_y$, or a mixture thereof, the particle size of the substances that react with one another (Si and $SiO_2$) being advantageously less than 0.3 mm. The weight ratio of Si to $SiO_2$ is advantageously in the range from 0.15:1 to 0.75:1 (parts by weight); preferably, a stoichiometric mixture is present. The amount of $SiO_y$ may be selected in accordance with practical requirements. $SiO_y$ present in the vaporiser vaporises directly. Si and $SiO_2$ react at a temperature of more than 1300° C. to form silicon monoxide vapour. The ratio of the thickness to the surface area of the plane-parallel structures is preferably less than 0.01 $\mu m^{-1}$. The separating agent condensed onto the carrier may be a water-soluble inorganic salt vaporisable in vacuo or a soluble organic substance vaporisable in vacuo.

In accordance with the invention, step c) is carried out at a pressure that is higher than the pressure in steps a) and b) and lower than atmospheric pressure.

The movable carrier preferably comprises one or more continuous metal belts, with or without a polymer coating, or one or more polyimide or polyethylene terephthalate belts. The movable carrier may furthermore comprise one or more discs, cylinders or other rotationally symmetrical bodies, which rotate about an axis.

In accordance with a preferred embodiment of the invention, a plurality of separating agent layers and silicon suboxide layers in alternating succession are vapour-deposited onto the movable carrier in vacuo, before being removed by dissolution of the condensed separating agent layers. The plane-parallel structures of $SiO_y$ are separated from the separating agent solvent preferably by washing-out and subsequent filtration, sedimentation, centrifugation, decanting or evaporation. Furthermore, the plane-parallel structures of silicon suboxide may, after washing-out of the dissolved separating agent contained in the solvent, be frozen together with the solvent and subsequently subjected to a process of freeze-drying, whereupon the solvent is separated off as a result of sublimation below the triple point and the dry silicon suboxide remains behind in the form of individual plane-parallel structures. The plane-parallel structures of silicon suboxide are preferably oxidised to silicon dioxide at a temperature of more than 200° C., preferably from 500 to 1000° C., in the presence of an oxygen-containing gas, which may also be air, in a heaped bed or in the form of loose material or in a fluidised bed. After the afore-mentioned oxidative treatment has been carried out, the plane-parallel structures of silicon oxide may be subjected to further coating or surface modification by adding further substances in gaseous form to the oxygen-containing gas, the temperature being from 0° to 250° C.

The silicon suboxide condensed onto the movable carrier corresponds to the formula $SiO_y$, wherein $1 \leq y \leq 1.8$, preferably wherein $1.1 \leq y \leq 1.5$. It is also possible, by using an excess of silicon in the vaporiser material, to obtain y values of less than 1, down to y=0.95.

In the production method described hereinbefore, further vaporisable substances such as organic pigments, especially metals or metal oxides are preferably admixed with the silicon suboxide with the aim of providing the plane-parallel structures of silicon dioxide with optically absorbing properties, it being possible for admixture to be effected either In the solid phase or in the vapour phase by means of vaporisation from a second source.

In the production method described hereinbefore, after oxidation has been carried out, surface treatment of the produced plane-parallel structures of silicon dioxide can be carried out by subjecting them to dipping, spraying or vapour treatment with at least one organic silane compound (such as, for example, a silane oligomer) and/or at least one fluorine-containing organic compound for the purpose of obtaining coupling properties with respect to other organic compounds or for producing hydrophilic, hydrophobic or antistatic surfaces. The plane-parallel structures of silicon dioxide can be present in suspended form in the surface coating or dispersion and, after the latter have dried, hard layers containing embedded structures oriented approximately parallel to the surface can be formed, which structures, in terms of their refractive index, differ by less than $\Delta n=+/-0.2$ from the refractive index of the surface coating or the dispersion and, at the same time, increase the abrasion resistance and impact resistance of the surface. It is possible, when producing surface coating or dispersion layers, for the surface tension of the plane-parallel structures suspended therein to be so modified by means of additives that they are oriented approximately parallel at or near the surface. The surface tension of the plane-parallel structures may already have been modified before introduction into the surface coating or dispersion by treating with substances in liquid or vapour form, which may be silane oligomers or fluorine-containing organic compounds, with the aim of causing the plane-parallel structures to be oriented approximately parallel at or near the surface when the surface coating or dispersion dries.

Examples in accordance with the present invention are described hereinbelow.

EXAMPLE I

In a vacuum system which in its fundamental points is constructed analogously to U.S. Pat. No. 6,270,840, or as an alternative in a batch system, the following are vaporised, from vaporisers, in succession: sodium chloride (NaCl) as separating agent at about 900° C., and silicon monoxide (SiO) as reaction product of Si and $SiO_2$ at from 1350 to 1550° C. The layer thickness of NaCl is typically 30-40 nm, that of SiO being, depending on the intended purpose of the end product, from 20 to 2000 nm, in the present case 200 nm. The resistance-heated vaporisers are so configured in accordance with the known art that good uniformity is obtained over the working width. Vaporisation is carried out at about 0.02 Pa, amounting to about 11 g of NaCl and 72 g of SiO per minute. For subsequently detaching the layers by dissolution of the separating agent, the carrier on which vapour-depositon has taken place is sprayed at about 3000 Pa with deionised water and treated with mechanical assistance using scrapers and with ultrasound. The NaCl enters solution, the $SiO_y$ layer, which is insoluble, breaks up into flakes. The suspension is continuously removed from the dissolution chamber and, at atmospheric pressure, is concentrated by filtration and rinsed several times with deionised water in order to remove $Na^+$ and $Cl^-$ ions that are present. That is followed by the steps of drying and (for the purpose of oxidising $SiO_y$ to $SiO_2$) heating the plane-parallel $SiO_y$ structures in the form of loose material at 700° C. for two hours in an oven through which air heated to 700° C. is passed. After cooling, comminution and grading by air-sieving are carried out. The product can be delivered for further use.

EXAMPLE II

The steps of vapour-deposition and dissolution are the same as in Example I except that the vaporiser is filled with a mixture of commercially available silicon monoxide, silicon and silicon dioxide. That mixture is vaporised at about 1450° C., whereupon SiO that is present vaporises directly and the portions of Si and $SiO_2$ simultaneously react to form SiO. The resulting vapour is directed onto the passing carrier, where it condenses. After washing-out of the $Na^+$ and $Cl^-$ ions, the solid is concentrated by means of filtration. The filtered material, which is still wet, containing about 25% residual water, is frozen on a commercially available belt freezer at $-5°$ C. in the form of a layer 5 mm thick and is treated in a commercially available freeze-drying belt system. By virtue of the slow sublimation of the ice below the triple point of water, the $SiO_y$ structures are, unlike in an evaporation method, not entrained and do not tend to form lumps. After a duration time of 2 hours they are discharged in dry form, they are oxidised to $SiO_2$ at 800° C. under air, and after cooling they are delivered to the process of grinding and air-sieving.

The products produced in accordance with Examples I and II may also be further treated at their surface in accordance with known methods in order to obtain hydrophobic, hydrophilic or antistatic properties or to allow coupling of organic compounds. They may be further coated, for example to form dye supports, catalyst supports or additives in abrasion-resistant surface-coatings. In the latter case, the product remains invisible even in a surface coating having the clarity of water because the refractive indices are almost the same. The plane-parallel structures become oriented parallel to the surface of the coated object and, after subsequent treatment described hereinbelow, form a hard layer similar to overlapping scales close to the surface of the surface coating, unlike the known additives of three-dimensional quartz particles.

In order to achieve orientation of the plane-parallel structures of silicon dioxide approximately parallel to the surface of the surface coating layer(s), the surface tension of the structures can be modified by adding known chemicals to the surface coating, for example by means of commercially available silane oligomers. Such oligomers, known under the trade names DYNASILAN™, HYDROSIL™, PROTECTOSIL™ can also be deposited directly onto the surface of the plane-parallel structures, either from a liquid phase or by condensation, before the latter are introduced into the surface coating. Because such organic oligomers have only limited temperature resistance, it has proved advantageous to carry out such treatment only after oxidation to $SiO_2$ has taken place, at temperatures from 0° to 250° C.

The flakes of the present invention are not of a uniform shape. Nevertheless, for purposes of brevity, the flakes will be referred to as having a "diameter." The $SiO_2$ flakes have a high plane-parallelism and a defined thickness in the range of $\pm 10\%$, especially $\pm 5\%$ of the average thickness. The $SiO_2$ flakes have a thickness of from 20 to 2000 nm, especially from 100 to 350 nm. It is presently preferred that the diameter of the flakes be in a preferred range of about 1-60 μm with a more preferred range of about 5-40 μm. Thus, the aspect ratio of the flakes of the present invention is in a preferred range of about 2.5-625 with a more preferred range of about 50-250.

The $SiO_2$ flakes can be provided with one or more metal oxide and/or metal layers, wherein in case of the metal oxide a metal oxide layer having a high index of refraction is deposited first. The metal oxide layers can be applied by CVD (chemical vapour deposition) or by wet chemical coating, because the plane-parallel structures of $SiO_2$ can be subjected to thermal loading up to more than 1000° C. It being possible, where appropriate, for the metal oxides to be reduced (DE-A-19502231, WO97/39065, DE-A-19843014 and WO00/17277).

It is possible to obtain pigments that are more intense in colour and more transparent by applying, on top of the $TiO_2$ layer, a metal oxide of low refractive index, such as $SiO_2$, $Al_2O_3$, AlOOH, $B_2O_3$ or a mixture thereof, preferably $SiO_2$, and applying a further $TiO_2$ layer on top of the latter layer (EP-A-892832, EP-A-753545, WO93/08237, WO98/53011, WO9812266, WO9838254, WO99/20695, WO00/42111, and EP-A-1213330).

In the case of the wet chemical coating, the wet chemical coating methods developed for the production of pearlescent pigments may be used; these are described, for example, in DE-A-14 67468, DE-A-19 59 988, DE-A-20 09 566, DE-A-22 14 545, DE-A-22 15 191, DE-A-22 44 298, DE-A-23 13 331, DE-A-25 22 572, DE-A-31 37 808, DE-A-31 37 809, DE-A-31 51 343, DE-A-31 51 354, DE-A-31 51 355, DE-A-32 11 602 and DE-A-32 35 017, DE 195 99 88, WO 93/08237, and WO 98/53001.

Pigments on the basis of $SiO_2$ substrates, comprising a metal oxide of high index of refraction and optionally on top of the metal oxide of high index of refraction a metal oxide of low index of refraction, or a semi-transparent metal layer are preferred.

Pigments on the basis of $SiO_2$ substrates, which have been coated by a wet chemical method, in the indicated order are particularly preferred:
$TiO_2$ (substrate: $SiO_2$; layer: $TiO_2$), $(SnO_2)TiO_2$, $Fe_2O_3$, $Fe_2O_3.TiO_2$ (substrate: $SiO_2$; mixed layer of $Fe_2O_3$ and $TiO_2$), $TiO_2/Fe_2O_3$ (substrate: $SiO_2$; first layer: $TiO_2$; second layer: $Fe_2O_3$), $TiO_2$/Berlin blau, $TiO_2/Cr_2O_3$, $TiO_2/FeTiO_3$, $TiO_2/SiO_2/TiO_2$, $(SnO_2)TiO_2/SiO_2/TiO_2$, $TiO_2/SiO_2/TiO_2/SiO_2/TiO_2$ or $TiO_2/SiO_2/Fe_2O_3$.

Suitable metal oxide layers having a high index of refraction are especially $TiO_2$, $ZrO_2$, $Fe_2O_3$, $Fe_3O_4$, $Cr_2O_3$, ZnO, or a mixture of those oxides, or an iron titanate, an iron oxide hydrate, a titanium suboxide or a mixture or mixed phase of those compounds. The coating with the metal oxide layer, especially $TiO_2$ layer, can be done by wet chemical coating as described in WO93/08237 or by CVD as described in DE-A-19614637.

It is furthermore possible to subject the finished pigment to subsequent coating or subsequent treatment which further increases the light, weather and chemical stability or which facilitates handling of the pigment, especially its incorporation into various media. For example, the procedures described in DE-A-22 15 191, DE-A-31 51 354, DE-A-32 35 017 or DE-A-33 34 598 are suitable as subsequent treatment or subsequent coating. Instead of the metal oxide layer a semi-transparent metal layer can be used. Suitable metals are, for example, Cr, Ti, Mo, W, Al, Cu, Ag, Au, or Ni. Preferred pigments have the following layer structure: $SiO_2$ flakes+metal+$SiO_2$+metal oxide having a high index of refraction.

It is furthermore possible to convert plane-parallel structures of $SiO_y$, starting from their surface, partially to silicon carbide (SiC) (in the context of the present Application, this procedure shall be referred to as "carburisation"). In similar manner to the oxidative conversion of $SiO_y$ structures to $SiO_2$ In accordance with the invention, described in Example 1, it is possible to convert plane-parallel structures of $SiO_y$ to SiC in a separate subsequent method. This is not a coating operation. This processing step results in modified chemical and mechanical properties.

After partial conversion to SiC, the surface of the plane-parallel structures is distinguished, in comparison to $SiO_2$, by greater hardness, reduced electrical insulation properties and reflection in the infra-red of up to 80% as opposed to reflection of 8% in the case of $SiO_2$ structures. In accordance with the invention, the conversion is carried out on all sides, that is to say even at the side edges of the structures. Such a conversion makes use of the fact that $SiO_y$ reacts at elevated temperature in the presence of carbon-containing gases to form SiC. The plane-parallel structures obtained by such means are novel and the present invention relates also thereto.

Consequently, the present invention relates also to plane-parallel structures (pigments) based on plane-parallel $SiO_z$ substrates having on their surface a layer comprising silicon carbide (SiC), wherein $0.95 \leq z \leq 2$. The $SiO_y$-to-$SiO_2$ reaction takes place starting from the surface of the plane-parallel structures and accordingly results in a gradient rather than a sharp transition. This means that, in that embodiment, the SiC-containing layer consists of $(SiO_y)_a$ and $(SiC)_b$, wherein $0 \leq a < 1$ and $0 < b \leq 1$, with b being 1 and a being 0 close to the surface of the pigment and the amount of SiC approaching 0 close to the boundary with the $SiO_y$ substrate. The $SiO_y$ structures, which are from about 20 nm to about 2000 nm thick, are sufficiently porous for such a reaction not to be limited only to the uppermost layer of $SiO_y$ molecules.

The invention does not relate, however, to the production of material in powder form in accordance with the prior art by means of the reaction of two gases, but rather to the partial or complete conversion of the plane-parallel structures of $SiO_y$ produced in accordance with the invention to silicon carbide (SiC), starting from their surfaces. It is found, surprisingly, that in the case of plane-parallel structures having a thickness in the region of less than 2000 nm the conversion of $SiO_y$ to SiC already begins at relatively low temperatures, namely from about 500° C.

For that purpose, the plane-parallel $SiO_y$ structures obtained in Examples I and II, after they have been dried, are not further oxidised using an oxygen-containing gas as in Examples I and II but rather they are caused to react in a gas-tight reactor heatable to a maximum of about 1500° C., preferably in the form of loose material, with a carbon-containing gas selected from alkynes, for example acetylene, alkanes, for example methane, alkenes, aromatic compounds or the like, and mixtures thereof optionally in admixture with an oxygen containing compound, such as, for example, aldehydes, ketones, water, carbon monoxide, carbon dioxide or the like, or mixtures thereof, at from 500 to 1500° C., preferably from 500 to 1000° C., and advantageously with the exclusion of oxygen. In order to temper the reaction, an inert gas, for example argon or helium, may be admixed with the carbon-containing gas.

At temperatures of less than about 500° C., that reaction generally proceeds too slowly whereas temperatures of more than about 1500° C. necessitate expensive lining of the reaction vessel with inert materials such as SiC, carbon, graphite or composite materials thereof. At pressures of less than about 1 Pa the reaction generally also proceeds too slowly whereas, especially when the carbon-containing gases are less reactive or are highly diluted with inert gas, it is perfectly possible to operate at pressures of up to about 4000 bar, as are routinely used, for example, in HIP ("hot isostatic pressing") systems.

In such carburisation, it is possible for all of the $SiO_y$ to be reacted to form SiC; preferably from 5 to 90% by weight of the $SiO_y$ are reacted to form SiC.

EXAMPLE III

The plane-parallel $SiO_y$ structures produced in Example I are, after drying, heated in a gas-tight reactor, through which a mixture of argon and acetylene is being passed, to a temperature of 850° C. The working pressure is 1 bar.

Step a:

A stream of argon gas at 900° C. is applied to an electrically heated reactor having a volume of 2 litres and containing 20 g of loose material of previously dried plane-parallel $SiO_y$ structures, prepared as in Example I, until all the loose material has reached that temperature. Monomolecular layers of water adsorbed onto the loose material are desorbed as a result and carried away by the stream of argon.

Step b:

As soon as the argon emerging from the loose material (which may, where appropriate, be agitated) exhibits a temperature drop of less than 10° C. with respect to the hot gas entering, 5% by volume of acetylene is admixed with the argon, the temperature being maintained at 850° C. The gas is introduced at a number of places in the loose material and is supplied by means of a manifold comprising INCONEL™ tubes having an internal diameter of 2 mm. The mass flow of acetylene is 1 mol per hour.

Step c:

After a treatment time of 2 hours, which has been found by experiment in preliminary trials to be advantageous, the acetylene gas stream is shut down and, with the heating switched off, subsequent flushing with pure argon is carried out for 10 minutes more until the gas outlet temperature has dropped to below 500° C. The obtained product showed a surface resistivity of less than 50000 ohm per square. It is assumed that the surface conductivity is caused by an extremely thin carbon layer, as the flakes become non-conducting, if heated in air.

Step d (this Step is Optional):

The argon supply is replaced by a supply of air at 400° C., with controlled heating, which is maintained over 15 minutes. The residual $SiO_y$ in the plane-parallel structures oxidises to $SiO_2$. After a further 15 minutes, cool air at room temperature is passed through the loose material. After a further 15 minutes, the product can be removed at approximately room temperature.

The temperature for the process of conversion of $SiO_y$ to SiC is from 500° to 1500° C., preferably from 500° C. to 1000° C., with a process duration of from about one hour to about twenty hours. The reaction takes place starting from the surface of the plane-parallel structures and accordingly results in a gradient rather than a sharp transition. The $SiO_y$ structures, which are from about 20 nm to about 2000 nm thick, are sufficiently porous for such a reaction not to be limited only to the uppermost layer of $SiO_y$ molecules.

The parameters of temperature, duration time and gas flow can be varied within wide limits and result in different degrees of conversion and different conversion profiles, by which means it is possible to influence the properties of the product.

After carbide formation has been terminated, it is possible, optionally, for residual $SiO_y$ still present in the plane-parallel structures to be converted into $SiO_2$ by oxidation with an oxygen-containing gas, without destroying the SiC formed. Because of the large specific surface area of the plane-parallel structures, temperatures of about 400° C. should not, in this case, be exceeded in the presence of oxygen, in contrast to structures entirely of SiC, which can be used in air up to about 1300° C. and in which the protective layer of $SiO_2$ that is formed, which is about 1000 nm thick, prevents further oxidation. The thickness of the structures produced in accordance with the invention is, however, from 20 to 2000 nm, preferably, from 100 to 350 nm for most applications. Complete conversion of SiC into $SiO_2$ would be the consequence if an excessively high oxidation temperature were to be used.

The product obtained by means of such conversion reflects up to about 80% in the infra-red range of >10 µm, analogously to the disclosure of http://www.cvdmaterials.com (Rohm & Haas). Therefore, in its transparency, the product has the properties of an approximately monochromatic filter. Such products are especially suitable in combination with surface coatings for paints for reducing thermal emission at room temperature. In contrast to metals, such products are very corrosion-resistant. The invention relates also to the use of corrosion-resistant additives which selectively reflect in the infra-red range.

It is a substantial advantage of the product that, by virtue of such conversion of $SiO_y$ to SiC at the surfaces of the plane-parallel structures, it is possible to obtain at those surfaces different chemical, mechanical and infra-red properties. The surfaces converted to SiC facilitate further processing of such plane-parallel structures. Depending on their thickness, the latter have specific surface areas of up to 20 $m^2/g$ and, in contrast to $SiO_2$ structures, require less in the way of measures protecting against inhalation when the solid material is further processed and used.

By virtue of the fact that the longer the reaction time and the higher the temperature in the reactor the thicker the outer SiC zones become at the expense of the inner $SiO_y$ zone, the surface properties may be varied in convenient manner. The $SiC/SiO_y$ transitions are continuous so that they consist of zones rather than layers.

Such zones function as a multi-layer structure, although only a single layer, namely the $SiO_y$ layer, has been produced by vapour-deposition in vacuo and the external zones of the plane-parallel structures have merely been converted to SiC in an uncomplicated process outside the vacuum apparatus.

Such plane-parallel structures are novel and the present invention relates also thereto. The same is also true of the methods for their preparation. Such plane-parallel structures are suitable as additives to transparent or semi-transparent surface coatings or dispersions; they are heat- and UV-resistant and, unlike aluminium structures, do not react with water in 'water-based' surface coatings, which are now gaining importance for ecological reasons.

Because the $SiO_2/SiC$ pigment according to the invention has high transparency in visible light and high reflectivity in the IR range, especially NIR range, it is suitable for use in the following areas:

(a) retro-reflective films, which are described, for example, in WO 97/42261 and U.S. Pat. No. 5,387,458;

(b) solar-energy-controlling films of various construction, which are described, for example, in GB 2 012 668; EP-A-355 962 and U.S. Pat. Nos. 3,290,203; 3,681,179; 3,776,805 and 4,095,013;

(c) corrosion-resistant silvered mirrors and solar reflectors, which are described, for example, in U.S. Pat. No. 4,645,714;
(d) labels with reflective printing, which are described, for example, in U.S. Pat. No. 5,564,843;
(e) UV-absorbing glass and glass coatings, which are described, for example, in U.S. Pat. Nos. 5,372,889; 5,426,204; 5,683,804 and 5,618,626;
(f) agricultural films for keeping off the IR radiation of the sun, so preventing excessive heating of, for example, a greenhouse;
(g) films/glazes, which are described, for example, in WO 92/01557; JP 75-33286; 93-143668; 95-3217 and 96-143831; and U.S. Pat. No. 5,643,676;
(h) windscreens and intermediate layers, which are described, for example, in JP 80-40018; 90-192118; 90-335037; 90-335038; 92-110128 and 94-127591; and U.S. Pat. No. 5,618,863;
(i) optical films, which are described, for example, in WO 97/32225; and U.S. Pat. Nos. 4,871,784 and 5,217,794; and
(j) films, which reduce or change the emitted infrared (IR) energy of military systems, to reduce their susceptibility to IR sensors and/or IR guided weapons, which are described, for example, in U.S. Pat. No. 5,814,367.

The above described process can also be used to produce plane-parallel pigments comprising at least one $SiO_z$ layer, which comprises, on the top surface, but not on the bottom surface, and on the side surfaces of the $SiO_z$ layer, a layer comprising silicon carbide (SiC), wherein $0.95 \leq z \leq 2$. Such pigments can be produced, for example by PVD of a three layer structure, SiOy/substrate/SiOy and then heating of the three layer structure in a carbon containing gas, wherein the substrate is, for example, transition metals having a melting point greater than 1000° C., like Mo, Nb, Zr, Ti, Hf and W.

If, in the conversion described hereinbefore, a gas containing both carbon and nitrogen, for example ammonia, nitrogen, a primary, secondary or tertiary amine, is used instead of a carbon-containing gas, there is obtained a pigment whose SiC-containing layer consists of $(SiO_y)_a$, $(SiC)_b$ and $(Si_3N_4)_c$, wherein $0<a<1$, $0<b<1$ and $0<c<1$, with a being 0 close to the surface of the pigment and with the amounts of SiC and $Si_3N_4$ approaching 0 close to the boundary with the $SiO_y$ substrate. It is possible for all of the $SiO_y$ to be reacted to form $Si_3N_4$/SiC; preferably, from 5 to 90% by weight of the $SiO_y$ are reacted to form $Si_3N_4$/SiC.

The parameters of temperature, duration time and gas flow can be varied within wide limits and result in different degrees of conversion and different conversion profiles, by which means it is possible to influence the properties of the product.

After carbide formation and nitride formation have been terminated, it is possible, optionally, for residual $SiO_y$ still present in the plane-parallel structures to be converted into $SiO_2$ by oxidation with an oxygen-containing gas, without destroying the $Si_3N_4$/SiC formed. Because of the large specific surface area of the plane-parallel structures, temperatures of about 400° C. should not, in this case, be exceeded in the presence of oxygen.

It is also possible partially to convert the substrates of $SiO_y$, starting from their surfaces, into silicon nitride $(Si_3N_4)$. After partial conversion to $Si_3N_4$, the surface of the $SiO_y$ structures is distinguished, in comparison to $SiO_2$, by greater hardness, high strength, outstanding resistance to wear and very good chemical resistance. In accordance with the invention, the conversion is carried out on all sides, that is to say even at the side edges of the structures. Such a conversion makes use of the fact that $SiO_y$ reacts at elevated temperature in the presence of nitrogen-containing gases to form $Si_3N_4$.

For that purpose, after they have been dried, the plane-parallel $SiO_y$ structures are caused to react in a gas-tight reactor heatable to a maximum of about 1500° C., preferably in the form of loose material, with a nitrogen-containing gas, for example ammonia, nitrogen or a mixture thereof, at from 500 to 1500° C., preferably from 500 to 1000° C., and advantageously with the exclusion of oxygen. In order to temper the reaction, an inert gas, for example argon or helium, may be admixed with the nitrogen-containing gas.

It is possible for all of the $SiO_y$ to be reacted to form $Si_3N_4$; preferably, from 5 to 90% by weight of the $SiO_y$ are reacted to form $Si_3N_4$. The temperature for the process of conversion from $SiO_y$ to $Si_3N_4$ is from 500° to 1500° C., preferably from 500° C. to 1000° C. The reaction takes place starting from the surface of the plane-parallel structures and accordingly results in a gradient rather than a sharp transition. This means that, in this embodiment, the $Si_3N_4$-containing layer consists of $(SiO_y)_a$ and $(Si_3N_4)_d$, wherein $0 \leq a<1$ and $0<d \leq 1$, with d being 1 and a being 0 close to the surface of the pigment and the amount of $Si_3N_4$ approaching 0 close to the boundary with the $SiO_y$ substrate.

The parameters of temperature, duration time and gas flow can be varied within wide limits and result in different degrees of conversion and different conversion profiles, by which means it is possible to influence the properties of the product.

After nitride formation has been terminated, it is possible, optionally, for residual $SiO_y$ still present in the plane-parallel structures to be converted into $SiO_2$ by oxidation with an oxygen-containing gas. Because of the large specific surface area of the plane-parallel structures, temperatures of about 400° C. should not, in this case, be exceeded in the presence of oxygen.

The present invention relates furthermore to novel (plane-parallel) pigments based on $SiO_z$ substrates in platelet form having, on the surface of the $SiO_z$ substrates, a layer comprising silicon carbide (SiC). The pigments are highly shear-stable and, in plastics, surface coatings or printing inks, result in high degrees of saturation and excellent fastness properties and also, in the case of interference pigments, a high degree of goniochromicity.

The pigment particles generally have a length of from 2 μm to 5 mm, a width of from 2 μm to 2 mm, and a thickness of from 20 nm to 1.5 μm, and a ratio of length to thickness of at least 2:1, the particles having a core of $SiO_z$ having two substantially parallel faces, the distance between which is the shortest axis of the core, and having an SiC-containing layer applied to the entire surface of the core and, optionally, further layers.

In order to obtain pigments having intense colours, further layers may be applied to the SiC and/or $Si_3N_4$ layer of the pigments described hereinbefore.

In a further embodiment, the pigment comprises a further layer of a dielectric material having a "high" refractive index, that is to say a refractive index greater than about 1.65, which is applied to the entire surface of the SiC-containing layer. Examples of such a dielectric material are zinc sulfide (ZnS), zinc oxide (ZnO), zirconium oxide $(ZrO_2)$, titanium dioxide $(TiO_2)$, carbon, indium oxide $(In_2O_3)$, indium tin oxide (ITO), tantalum pentoxide $(Ta_2O_5)$, cerium oxide $(CeO_2)$, yttrium oxide $(Y_2O_3)$, europium oxide $(Eu_2O_3)$, iron oxides such as iron(II)/iron(III) oxide $(Fe_3O_4)$ and iron(III) oxide $(Fe_2O_3)$, hafnium nitride (HfN), hafnium carbide (HfC), hafnium oxide (HfO$_2$), lanthanum oxide (La$_2$O$_3$), magnesium oxide (MgO), neodymium oxide (Nd$_2$O$_3$), praseodymium oxide (Pr$_6$O$_{11}$), samarium oxide (Sm$_2$O$_3$), antimony trioxide (Sb$_2$O$_3$), silicon monoxides (SiO), selenium trioxide (Se$_2$O$_3$), tin oxide (SnO$_2$), tungsten trioxide (WO$_3$) or combinations thereof. The dielectric material is preferably a metal oxide, it being possible for the metal oxide to be a single oxide or a mixture of oxides, with or without absorbing properties, for example TiO$_2$, ZrO$_2$, Fe$_2$O$_3$, Fe$_3$O$_4$, Cr$_2$O$_3$ or ZnO, with TiO$_2$ being especially preferred.

In this embodiment the thickness of the SiO$_z$ layer is generally from 20 to 1000 nm, preferably from 50 to 500 nm, that of the SiC layer from 1 to 500 nm, preferably from 10 to 50 nm, and that of the TiO$_2$ layer generally from 1 to 100 nm, preferably from 5 to 50 nm.

Additional coatings may be applied in a manner known per se for the purpose of stabilisation with respect to weather and light.

The metal oxide layers can be applied by CVD (chemical vapour deposition) or by wet chemical coating. The metal oxide layers can be obtained by decomposition of metal carbonyls in the presence of water vapour (relatively low molecular weight metal oxides such as magnetite) or in the presence of oxygen and, where appropriate, water vapour (e.g. nickel oxide and cobalt oxide). The metal oxide layers are especially applied by means of oxidative gaseous phase decomposition of metal carbonyls (e.g. iron pentacarbonyl, chromium hexacarbonyl; EP-A-45 851), by means of hydrolytic gaseous phase decomposition of metal alcoholates (e.g. titanium and zirconium tetra-n- and -iso-propanolate; DE-A-41 40 900) or of metal halides (e.g. titanium tetrachloride; EP-A-338 428), by means of oxidative decomposition of organyl tin compounds (especially alkyl tin compounds such as tetrabutyltin and tetramethyltin; DE-A-44 03 678) or by means of the gaseous phase hydrolysis of organyl silicon compounds (especially di-tert-butoxyacetoxysilane) described in EP-A-668 329, it being possible for the coating operation to be carried out in a fluidised-bed reactor (EP-A-045 851 and EP-A-106 235). Al$_2$O$_3$ layers (B) can advantageously be obtained by controlled oxidation during the cooling of aluminium-coated pigments, which is otherwise carried out under inert gas (DE-A-195 16 181).

Phosphate-, chromate- and/or vanadate-containing and also phosphate- and SiO$_2$-containing metal oxide layers can be applied in accordance with the passivation methods described in DE-A-42 36 332 and in EP-A-678 561 by means of hydrolytic or oxidative gaseous phase decomposition of oxide-halides of the metals (e.g. CrO$_2$Cl$_2$, VOCl$_3$), especially of phosphorus oxyhalides (e.g. POCl$_3$), phosphoric and phosphorous acid esters (e.g. di- and tri-methyl and di- and tri-ethyl phosphite) and of amino-group-containing organyl silicon compounds (e.g. 3-aminopropyl-triethoxy- and -trimethoxy-silane.

Layers of oxides of the metals zirconium, titanium, iron and zinc, oxide hydrates of those metals, iron titanates, titanium suboxides or mixtures thereof are preferably applied by precipitation by a wet chemical method, it being possible, where appropriate, for the metal oxides to be reduced. In the case of the wet chemical coating, the wet chemical coating methods developed for the production of pearlescent pigments may be used; these are described, for example, in DE-A-1 4 67 468, DE-A-1 9 59 988, DE-A-20 09 566, DE-A-22 14 545, DE-A-22 15 191, DE-A-22 44 298, DE-A-23 13 331, DE-A-25 22 572, DE-A-31 37 808, DE-A-31 37 809, DE-A-31 51 343, DE-A-31 51 354, DE-A-31 51 355, DE-A-32 11 602 and DE-A-32 35 017.

For the purpose of coating, the substrate particles are suspended in water and one or more hydrolysable metal salts are added at a pH suitable for the hydrolysis, which is so selected that the metal oxides or metal oxide hydrates are precipitated directly onto the particles without subsidiary precipitation occurring. The pH is usually kept constant by simultaneously metering in a base. The pigments are then separated off, washed, dried and, where appropriate, baked, it being possible to optimise the baking temperature with respect to the coating in question. If desired, after individual coatings have been applied, the pigments can be separated off, dried and, where appropriate, baked, and then again re-suspended for the purpose of precipitating further layers.

The metal oxide layers are obtainable, for example, in analogy to a method described in DE-A-1 95 01 307, by producing the metal oxide layer by controlled hydrolysis of one or more metal acid esters, where appropriate in the presence of an organic solvent and a basic catalyst, by means of a sol-gel process. Suitable basic catalysts are, for example, amines, such as triethylamine, ethylenediamine, tributylamine, dimethylethanolamine and methoxypropylamine. The organic solvent is a water-miscible organic solvent such as a C$_{1-4}$alcohol, especially isopropanol.

Suitable metal acid esters are selected from alkyl and aryl alcoholates, carboxylates, and carboxyl-radical- or alkyl-radical- or aryl-radical-substituted alkyl alcoholates or carboxylates of vanadium, titanium, zirconium, silicon, aluminium and boron. The use of triisopropyl aluminate, tetraisopropyl titanate, tetraisopropyl zirconate, tetraethyl orthosilicate and triethyl borate is preferred. In addition, acetylacetonates and acetoacetylacetonates of the aforementioned metals may be used. Preferred examples of that type of metal acid ester are zirconium acetylacetonate, aluminium acetylacetonate, titanium acetylacetonate and diisobutyloleyl acetoacetylaluminate or diisopropyloleyl acetoacetylacetonate and mixtures of metal acid esters, for example Dynasil® (Hüls), a mixed aluminium/silicon metal acid ester.

As a metal oxide having a high refractive index, titanium dioxide is preferably used, the method described in U.S. Pat. No. 3,553,001 being used, in accordance with an embodiment of the present invention, for application of the titanium dioxide layers.

An aqueous titanium salt solution is slowly added to a suspension of the material being coated, which suspension has been heated to about 50-100° C., especially 70-80° C., and a substantially constant pH value of about from 0.5 to 5, especially about from 1.2 to 2.5, is maintained by simultaneously metering in a base such as, for example, aqueous ammonia solution or aqueous alkali metal hydroxide solution. As soon as the desired layer thickness of precipitated TiO$_2$ has been achieved, the addition of titanium salt solution and base is stopped.

This method, also referred to as a titration method, is distinguished by the fact that an excess of titanium salt is avoided. That is achieved by feeding in for hydrolysis, per unit time, only that amount which is necessary for even coating with the hydrated TiO$_2$ and which can be taken up per unit time by the available surface of the particles being coated. In principle, the anatase form of TiO$_2$ forms on the surface of the starting pigment. By adding small amounts of SnO$_2$, however, it is possible to force the rutile structure to be formed. For example, as described in WO 93/08237, tin dioxide can be deposited before titanium dioxide precipitation and the product coated with titanium dioxide can be calcined at from 800 to 900° C.

Where appropriate, an $SiO_2$ protective layer can be applied on top of the titanium dioxide layer, for which the following method may be used: A soda waterglass solution is metered in to a suspension of the material being coated, which suspension has been heated to about 50-100° C., especially 70-80° C. The pH is maintained at from 4 to 10, preferably from 6.5 to 8.5, by simultaneously adding 10% hydrochloric acid. After addition of the waterglass solution, stirring is carried out for 30 minutes.

It is possible to obtain pigments that are more intense in colour and more transparent by applying, on top of the $TiO_2$ layer, a metal oxide of "low" refractive index, that is to say a refractive index smaller than about 1.65, such as $SiO_2$, $Al_2O_3$, AlOOH, $B_2O_3$ or a mixture thereof, preferably $SiO_2$, and applying a further $TiO_2$ layer on top of the latter layer.

It is, in addition, possible to modify the powder colour of the pigment by applying further layers such as, for example, coloured metal oxides or Berlin Blue, compounds of transition metals, e.g. Fe, Cu, Ni, Co, Cr, or organic compounds such as dyes or colour lakes.

It is furthermore possible to subject the finished pigment to subsequent coating or subsequent treatment which further increases the light, weather and chemical stability or which facilitates handling of the pigment, especially its incorporation into various media. For example, the procedures described in DE-A-22 15 191, DE-A-31 51 354, DE-A-32 35 017 or DE-A-33 34 598 are suitable as subsequent treatment or subsequent coating.

In addition, the pigment according to the invention can also be coated with poorly soluble, firmly adhering, inorganic or organic colourants. Preference is given to the use of colour lakes and, especially, aluminium colour lakes. For that purpose an aluminium hydroxide layer is precipitated, which is, in a second step, laked by using a colour lake (DE-A-24 29 762 and DE 29 28 287).

Furthermore, the pigment according to the invention may also have an additional coating with complex salt pigments, especially cyanoferrate complexes (EP-A-141 173 and DE-A-23 13 332).

The pigments according to the invention are very shear-stable, resulting from the fact that in the method of the invention a very good bond is obtained between $SiO_2$, SiC and SiN layers and the layers of dielectric material.

The pigments according to the invention can be used for all customary purposes, for example for colouring polymers in the mass, surface coatings (including effect finishes, including those for the automotive sector) and printing inks, and also, for example, for applications in cosmetics. Such applications are known from reference works, for example "Industrielle Organische Pigmente" (W. Herbst and K. Hunger, VCH Verlagsgesellschaft mbH, Weinheim/New York, 2nd, completely revised edition, 1995).

When the pigments according to the invention are interference pigments (effect pigments), they are goniochromatic and result in brilliant, highly saturated (lustrous) colours. They are accordingly very especially suitable for combination with conventional, transparent pigments, for example organic pigments such as, for example, diketopyrrolopyrroles, quinacridones, dioxazines, perylenes, isoindolinones etc., it being possible for the transparent pigment to have a similar colour to the effect pigment. Especially interesting combination effects are obtained, however, in analogy to, for example, EP 388 932 or EP 402 943, when the colour of the transparent pigment and that of the effect pigment are complementary.

The pigments according to the invention can be used with excellent results for pigmenting high molecular weight organic material.

The high molecular weight organic material for the pigmenting of which the pigments or pigment compositions according to the invention may be used may be of natural or synthetic origin. High molecular weight organic materials usually have molecular weights of about from $10^3$ to $10^8$ g/mol or even more. They may be, for example, natural resins, drying oils, rubber or casein, or natural substances derived therefrom, such as chlorinated rubber, oil-modified alkyd resins, viscose, cellulose ethers or esters, such as ethylcellulose, cellulose acetate, cellulose propionate, cellulose acetobutyrate or nitrocellulose, but especially totally synthetic organic polymers (thermosetting plastics and thermoplastics), as are obtained by polymerisation, polycondensation or polyaddition. From the class of the polymerisation resins there may be mentioned, especially, polyolefins, such as polyethylene, polypropylene or polyisobutylene, and also substituted polyolefins, such as polymerisation products of vinyl chloride, vinyl acetate, styrene, acrylonitrile, acrylic acid esters, methacrylic acid esters or butadiene, and also copolymerisation products of the said monomers, such as especially ABS or EVA.

From the series of the polyaddition resins and polycondensation resins there may be mentioned, for example, condensation products of formaldehyde with phenols, so-called phenoplasts, and condensation products of formaldehyde with urea, thiourea or melamine, so-called aminoplasts, and the polyesters used as surface-coating resins, either saturated, such as alkyd resins, or unsaturated, such as maleate resins; also linear polyesters and polyamides, polyurethanes or silicones.

The said high molecular weight compounds may be present singly or in mixtures, in the form of plastic masses or melts. They may also be present in the form of their monomers or In the polymerised state in dissolved form as film-formers or binders for surface coatings or printing inks, such as, for example, boiled linseed oil, nitrocellulose, alkyd resins, melamine resins and urea-formaldehyde resins or acrylic resins.

Depending on the intended purpose, it has proved advantageous to use the effect pigments or effect pigment compositions according to the invention as toners or in the form of preparations. Depending on the conditioning method or intended application, it may be advantageous to add certain amounts of texture-improving agents to the effect pigment before or after the conditioning process, provided that this has no adverse effect on use of the effect pigments for colouring high molecular weight organic materials, especially polyethylene. Suitable agents are, especially, fatty acids containing at least 18 carbon atoms, for example stearic or behenic acid, or amides or metal salts thereof, especially magnesium salts, and also plasticisers, waxes, resin acids, such as abietic acid, rosin soap, alkylphenols or aliphatic alcohols, such as stearyl alcohol, or aliphatic 1,2-dihydroxy compounds containing from 8 to 22 carbon atoms, such as 1,2-dodecanediol, and also modified colophonium maleate resins or fumaric acid colophonium resins. The texture-improving agents are added in amounts of preferably from 0.1 to 30% by weight, especially from 2 to 15% by weight, based on the end product.

The (effect) pigments according to the invention can be added in any tinctorially effective amount to the high molecular weight organic material being pigmented. A pigmented substance composition comprising a high molecular weight organic material and from 0.01 to 80% by weight, preferably from 0.1 to 30% by weight, based on the high molecular weight organic material, of an pigment according to the invention is advantageous. Concentrations of from 1 to 20% by weight, especially of about 10% by weight, can often be used in practice.

High concentrations, for example those above 30% by weight, are usually in the form of concentrates ("masterbatches") which can be used as colorants for producing pigmented materials having a relatively low pigment content, the pigments according to the invention having an extraordinarily low viscosity in customary formulations so that they can still be processed well.

For the purpose of pigmenting organic materials, the effect pigments according to the invention may be used singly. It is, however, also possible, in order to achieve different hues or colour effects, to add any desired amounts of other colour-imparting constituents, such as white, coloured, black or effect pigments, to the high molecular weight organic substances in addition to the effect pigments according to the invention. When coloured pigments are used in admixture with the effect pigments according to the invention, the total amount is preferably from 0.1 to 10% by weight, based on the high molecular weight organic material. Especially high goniochromicity is provided by the preferred combination of an effect pigment according to the invention with a coloured pigment of another colour, especially of a complementary colour, with colorations made using the effect pigment and colorations made using the coloured pigment having, at a measurement angle of 10°, a difference in hue ($\Delta H^*$) of from 20 to 340, especially from 150 to 210.

Preferably, the effect pigments according to the invention are combined with transparent coloured pigments, it being possible for the transparent coloured pigments to be present either in the same medium as the effect pigments according to the invention or in a neighbouring medium. An example of an arrangement in which the effect pigment and the coloured pigment are advantageously present in neighbouring media is a multi-layer effect surface coating.

The pigmenting of high molecular weight organic substances with the pigments according to the invention is carried out, for example, by admixing such a pigment, where appropriate in the form of a masterbatch, with the substrates using roll mills or mixing or grinding apparatuses. The pigmented material is then brought into the desired final form using methods known per se, such as calendering, compression moulding, extrusion, coating, pouring or injection moulding. Any additives customary in the plastics industry, such as plasticisers, fillers or stabilisers, can be added to the polymer, in customary amounts, before or after incorporation of the pigment. In particular, in order to produce non-rigid shaped articles or to reduce their brittleness, it is desirable to add plasticisers, for example esters of phosphoric acid, phthalic acid or sebacic acid, to the high molecular weight compounds prior to shaping.

For pigmenting surface coatings and printing inks, the high molecular weight organic materials and the effect pigments according to the invention, where appropriate together with customary additives such as, for example, fillers, other pigments, siccatives or plasticisers, are finely dispersed or dissolved in the same organic solvent or solvent mixture, it being possible for the individual components to be dissolved or dispersed separately or for a number of components to be dissolved or dispersed together, and only thereafter for all the components to be brought together.

Dispersing an effect pigment according to the invention in the high molecular weight organic material being pigmented, and processing a pigment composition according to the invention, are preferably carried out subject to conditions under which only relatively weak shear forces occur so that the effect pigment is not broken up into smaller portions.

The colorations obtained, for example in plastics, surface coatings or printing inks, especially in surface coatings or printing inks, more especially in surface coatings, are distinguished by excellent properties, especially by extremely high saturation, outstanding fastness properties and high goniochromicity.

When the high molecular weight material being pigmented is a surface coating, it is especially a speciality surface coating, very especially an automotive finish.

The effect pigments according to the invention are also suitable for making-up the lips or the skin and for colouring the hair or the nails.

The invention accordingly relates also to a cosmetic preparation or formulation comprising from 0.0001 to 90% by weight of a pigment, especially an effect pigment, according to the invention and from 10 to 99.9999% of a cosmetically suitable carrier material, based on the total weight of the cosmetic preparation or formulation.

Such cosmetic preparations or formulations are, for example, lipsticks, blushers, foundations, nail varnishes and hair shampoos.

The pigments may be used singly or in the form of mixtures. It is, in addition, possible to use pigments according to the invention together with other pigments and/or colorants, for example in combinations as described hereinbefore or as known in cosmetic preparations.

The cosmetic preparations and formulations according to the invention preferably contain the pigment according to the invention in an amount from 0.005 to 50% by weight, based on the total weight of the preparation.

Suitable carrier materials for the cosmetic preparations and formulations according to the invention include the customary materials used in such compositions.

The cosmetic preparations and formulations according to the invention may be in the form of, for example, sticks, ointments, creams, emulsions, suspensions, dispersions, powders or solutions. They are, for example, lipsticks, mascara preparations, blushers, eye-shadows, foundations, eyeliners, powder or nail varnishes.

If the preparations are in the form of sticks, for example lipsticks, eye-shadows, blushers or foundations, the preparations consist for a considerable part of fatty components, which may consist of one or more waxes, for example ozokerite, lanolin, lanolin alcohol, hydrogenated lanolin, acetylated lanolin, lanolin wax, beeswax, candelilla wax, microcrystalline wax, carnauba wax, cetyl alcohol, stearyl alcohol, cocoa butter, lanolin fatty acids, petrolatum, petroleum jelly, mono-, di- or tri-glycerides or fatty esters thereof that are solid at 25° C., silicone waxes, such as methyloctadecane-oxypolysiloxane and poly(dimethylsiloxy)stearoxysiloxane, stearic acid monoethanolamine, colophane and derivatives thereof, such as glycol abietates and glycerol abietates, hydrogenated oils that are solid at 25° C., sugar glycerides and oleates, myristates, lanolates, stearates and dihydroxystearates of calcium, magnesium, zirconium and aluminium.

The fatty component may also consist of a mixture of at least one wax and at least one oil, in which case the following oils, for example, are suitable: paraffin oil, purcelline oil, perhydrosqualene, sweet almond oil, avocado oil, calophyllum oil, castor oil, sesame oil, jojoba oil, mineral oils having a boiling point of about from 310 to 410° C., silicone oils, such as dimethylpolysiloxane, linoleyl alcohol, linolenyl alcohol, oleyl alcohol, cereal grain oils, such as wheatgerm oil, isopropyl lanolate, isopropyl palmitate, isopropyl myristate, butyl myristate, cetyl myristate, hexadecyl stearate, butyl stearate, decyl oleate, acetyl glycerides, octanoates and decanoates of alcohols and polyalcohols, for example of glycol and glycerol, ricinoleates of alcohols and polyalcohols, for example of cetyl alcohol, isostearyl alcohol, isocetyl lanolate, isopropyl adipate, hexyl laurate and octyl dodecanol.

The fatty components in such preparations in the form of sticks may generally constitute up to 99.91% by weight of the total weight of the preparation.

The cosmetic preparations and formulations according to the invention may additionally comprise further constituents, such as, for example, glycols, polyethylene glycols, polypropylene glycols, monoalkanolamides, non-coloured polymeric, inorganic or organic fillers, preservatives, UV filters or other adjuvants and additives customary In cosmetics, for example a natural or synthetic or partially synthetic di- or tri-glyceride, a mineral oil, a silicone oil, a wax, a fatty alcohol, a Guerbet alcohol or ester thereof, a lipophilic functional cosmetic active ingredient, including sun-protection filters, or a mixture of such substances.

A lipophilic functional cosmetic active ingredient suitable for skin cosmetics, an active ingredient composition or an active ingredient extract is an ingredient or a mixture of ingredients that is approved for dermal or topical application. The following may be mentioned by way of example:

active ingredients having a cleansing action on the skin surface and the hair; these include all substances that serve to cleanse the skin, such as oils, soaps, synthetic detergents and solid substances;

active ingredients having a deodorising and perspiration-inhibiting action: they include antiperspirants based on aluminium salts or zinc salts, deodorants comprising bactericidal or bacteriostatic. deodorising substances, for example triclosan, hexachlorophene, alcohols and cationic substances, such as, for example, quaternary ammonium salts, and odour absorbers, for example ®Grillocin (combination of zinc ricinoleate and various additives) or triethyl citrate (optionally in combination with an antioxidant, such as, for example, butyl hydroxytoluene) or ion-exchange resins;

active ingredients that offer protection against sunlight (UV filters): suitable active ingredients are filter substances (sunscreens) that are able to absorb UV radiation from sunlight and convert it into heat; depending on the desired action, the following light-protection agents are preferred: light-protection agents that selectively absorb sunburn-causing high-energy UV radiation in the range of approximately from 280 to 315 nm (UV-B absorbers) and transmit the longer-wavelength range of, for example, from 315 to 400 nm (UV-A range), as well as light-protection agents that absorb only the longer-wavelength radiation of the UV-A range of from 315 to 400 nm (UV-A absorbers);

suitable light-protection agents are, for example, organic UV absorbers from the class of the p-aminobenzoic acid derivatives, salicylic acid derivatives, benzophenone derivatives, dibenzoylmethane derivatives, diphenyl acrylate derivatives, benzofuran derivatives, polymeric UV absorbers comprising one or more organosilicon radicals, cinnamic acid derivatives, camphor derivatives, trianilino-s-triazine derivatives, phenylbenzimidazolesulfonic acid and salts thereof, menthyl anthranilates, benzotriazole derivatives, and/or an inorganic micropigment selected from aluminium oxide- or silicon dioxide-coated $TiO_2$, zinc oxide or mica;

active ingredients against insects (repellents) are agents that are intended to prevent insects from touching the skin and becoming active there; they drive insects away and evaporate slowly; the most frequently used repellent is diethyl toluamide (DEET); other common repellents will be found, for example, in "Pflegekosmetik" (W. Raab and U. Kindl, Gustav-Fischer-Verlag Stuttgart/New York, 1991) on page 161;

active ingredients for protection against chemical and mechanical influences: these include all substances that form a barrier between the skin and external harmful substances, such as, for example, paraffin oils, silicone oils, vegetable oils, PCL products and lanolin for protection against aqueous solutions, film-forming agents, such as sodium alginate, triethanolamine alginate, polyacrylates, polyvinyl alcohol or cellulose ethers for protection against the effect of organic solvents, or substances based on mineral oils, vegetable oils or silicone oils as "lubricants" for protection against severe mechanical stresses on the skin;

moisturising substances: the following substances, for example, are used as moisture-controlling agents (moisturisers): sodium lactate, urea, alcohols, sorbitol, glycerol, propylene glycol, collagen, elastin and hyaluronic acid;

active Ingredients having a keratoplastic effect: benzoyl peroxide, retinoic acid, colloidal sulfur and resorcinol;

antimicrobial agents, such as, for example, triclosan or quaternary ammonium compounds;

oily or oil-soluble vitamins or vitamin derivatives that can be applied dermally: for example vitamin A (retinol in the form of the free acid or derivatives thereof), panthenol, pantothenic acid, folic acid, and combinations thereof, vitamin E (tocopherol), vitamin F; essential fatty acids; or niacinamide (nicotinic acid amide);

vitamin-based placenta extracts: active ingredient compositions comprising especially vitamins A, C, E, $B_1$, $B_2$, $B_6$, $B_{12}$, folic acid and biotin, amino acids and enzymes as well as compounds of the trace elements magnesium, silicon, phosphorus, calcium, manganese, iron or copper;

skin repair complexes: obtainable from inactivated and disintegrated cultures of bacteria of the bifidus group;

plants and plant extracts: for example arnica, aloe, beard lichen, ivy, stinging nettle, ginseng, henna, camomile, marigold, rosemary, sage, horsetail or thyme;

animal extracts: for example royal jelly, propolis, proteins or thymus extracts;

cosmetic oils that can be applied dermally: neutral oils of the Miglyol 812 type, apricot kernel oil, avocado oil, babassu oil, cottonseed oil, borage oil, thistle oil, groundnut oil, gamma-oryzanol, rosehip-seed oil, hemp oil, hazelnut oil, blackcurrant-seed oil, jojoba oil, cherry-stone oil, salmon oil, linseed oil, cornseed oil, macadamia nut oil, almond oil, evening primrose oil, mink oil, olive oil, pecan nut oil, peach kernel oil, pistachio nut oil, rape oil, rice-seed oil, castor oil, safflower oil, sesame oil, soybean oil, sunflower oil, tea tree oil, grapeseed oil or wheatgerm oil.

The preparations in stick form are preferably anhydrous but may in certain cases comprise a certain amount of water which, however, in general does not exceed 40% by weight, based on the total weight of the cosmetic preparation.

If the cosmetic preparations and formulations according to the invention are in the form of semi-solid products, that is to say in the form of ointments or creams, they may likewise be anhydrous or aqueous. Such preparations and formulations are, for example, mascaras, eyeliners, foundations, blushers, eye-shadows, or compositions for treating rings under the eyes.

If, on the other hand, such ointments or creams are aqueous, they are especially emulsions of the water-in-oil type or of the oil-in-water type that comprise, apart from the pigment, from 1 to 98.8% by weight of the fatty phase, from 1 to 98.8% by weight of the aqueous phase and from 0.2 to 30% by weight of an emulsifier.

Such ointments and creams may also comprise further conventional additives, such as, for example, perfumes, antoxidants, preservatives, gel-forming agents, UV filters, colorants, pigments, pearlescent agents, non-coloured polymers as well as inorganic or organic fillers.

If the preparations are in the form of a powder, they consist substantially of a mineral or inorganic or organic filler such as, for example, talcum, kaolin, starch, polyethylene powder or polyamide powder, as well as adjuvants such as binders, colorants etc.

Such preparations may likewise comprise various adjuvants conventionally employed in cosmetics, such as fragrances, antioxidants, preservatives etc.

If the cosmetic preparations and formulations according to the invention are nail varnishes, they consist essentially of nitrocellulose and a natural or synthetic polymer in the form of a solution in a solvent system, it being possible for the solution to comprise other adjuvants, for example pearlescent agents.

In that embodiment, the coloured polymer is present in an amount of approximately from 0.1 to 5% by weight.

The cosmetic preparations and formulations according to the invention may also be used for colouring the hair, in which case they are used In the form of shampoos, creams or gels that are composed of the base substances conventionally employed In the cosmetics industry and a pigment according to the invention.

The cosmetic preparations and formulations according to the invention are prepared in conventional manner, for example by mixing or stirring the components together, optionally with heating so that the mixtures melt.

The Examples that follow illustrate the invention without limiting the scope thereof.

EXAMPLE 1

In a vacuum system which in its fundamental points is constructed analogously to the system described in U.S. Pat. No. 6,270,840, the following are vaporised, from vaporisers, in succession: sodium chloride (NaCl) as separating agent at about 900° C., and silicon monoxide (SiO) as reaction product of Si and $SiO_2$ at from 1350 to 1550° C. The layer thickness of NaCl is typically 30-40 nm, that of $SiO_y$ being, depending on the intended purpose of the end product, from 100 to 2000 nm, in the present case 200 nm. Vaporisation is carried out at about 0.02 Pa, amounting to about 11 g of NaCl and 72 g of SiO per minute. For subsequently detaching the layers by dissolution of the separating agent, the carrier on which vapour-deposition has taken place is sprayed at about 3000 Pa with deionised water and treated with mechanical assistance using scrapers and with ultrasound. The NaCl dissolves and the $SiO_y$ layer, which is insoluble, breaks up into flakes. The suspension is continuously removed from the dissolution chamber and, at atmospheric pressure, is concentrated by filtration and rinsed several times with deionised water in order to remove $Na^+$ and $Cl^-$ ions that are present. That is followed by the steps of drying and (for the purpose of oxidising $SiO_y$ to $SiO_2$) heating the plane-parallel $SiO_y$ structures in the form of loose material at 700° C. for two hours in an oven through which air heated to 700° C. is passed. After cooling, comminution and grading by air-sieving are carried out. The product can be delivered for further use.

EXAMPLE 2

The steps of vapour-deposition and dissolution are the same as in Example 1 except that the vaporiser is filled with a mixture of commercially available silicon monoxide, silicon and silicon dioxide. That mixture is vaporised at about 1450° C., whereupon SiO that is present vaporises directly and the portions of Si and $SiO_2$ simultaneously react to form SiO. The resulting vapour is directed onto the passing carrier, where it condenses. After washing-out of the $Na^+$ and $Cl^-$ ions, the solid is concentrated by means of filtration. The filtered material, which is still wet, containing about 25% residual water, is frozen on a commercially available belt freezer at −5° C. in the form of a layer 5 mm thick and is treated in a commercially available freeze-drying belt system. By virtue of the slow sublimation of the ice below the triple point of water, the $SiO_y$ structures are, unlike in an evaporation method, not entrained and do not tend to form lumps. After a duration time of 2 hours they emerge in dry form, they are oxidised to $SiO_2$ at 800° C. under air, and after cooling they are delivered to the process of grinding and air-sieving.

EXAMPLE 3

After drying, the plane-parallel $SiO_y$ structures produced in Example 1 are heated in a gas-tight reactor, through which a mixture of argon and acetylene is being passed, to a temperature of 850° C. The working pressure is 1 bar:

A stream of argon gas at 900° C. is applied to an electrically heated reactor having a volume of 2 litres and containing 20 g of loose material of previously dried plane-parallel, 350 nm thick $SiO_y$ structures, prepared as in Example 1, until all the loose material has reached that temperature. Monomolecular layers of water adsorbed onto the loose material are desorbed as a result and carried away by the stream of argon.

As soon as the argon emerging from the loose material (which may, where appropriate, be agitated) exhibits a temperature drop of less than 10° C. with respect to the hot gas entering, 10% by volume of acetylene is admixed with the argon, the temperature being maintained at 800° C. The gas is introduced at a number of places in the loose material and is supplied by means of a manifold comprising INCONEL™ tubes having an internal diameter of 2 mm. After a treatment time of 2, 4 and 7 hours, which have been found by experiment in preliminary trials to be advantageous, the acetylene gas stream is shut down and, with the heating switched off, subsequent flushing with pure argon is carried out for 10 minutes more until the gas outlet temperature has dropped to below 500° C.

The argon supply is replaced by a supply of air at 400° C., with controlled heating, which is maintained over 15 minutes. The residual $SiO_y$ in the plane-parallel structures oxidises to $SiO_2$. After a further 15 minutes, cool air at room temperature is passed through the loose material. After a further 15 minutes, the product can be removed at approximately room temperature.

In dependence upon the treatment time, different colours (reflectance and transmittance) are obtained:

| Example | Treatment time | Colour (reflectance) | Colour (transmittance) |
|---------|----------------|----------------------|------------------------|
| 3a | 2 | blue | yellow |
| 3b | 4 | green | reddish |
| 3c | 7 | yellow | blue |

EXAMPLE 4 a) The Pigments Obtained in Examples 3a to 3c are Coated with Titanium Dioxide in Known Manner by a Wet Chemical Method:

The pigments obtained in Examples 3a, 3b and 3c are, in each case, suspended in totally de-salted water and heated to 75° C. An aqueous $TiCl_4$ solution is metered in to the suspension. The pH is maintained at 2.2 throughout the addition, using 32% NaOH solution. After addition is complete, stirring at 75° C. is subsequently carried out for 30 minutes in order to complete the precipitation.

Starting from the pigments described in Examples 3a to 3c, pigments having a $TiO_2$ layer about 10 nm thick are obtained, their colours (reflectance) being as follows:

| Example | Starting material of Example | Colour (reflectance) |
|---------|------------------------------|----------------------|
| 4a | 3a | green |
| 4b | 3b | yellow |
| 4c | 3c | reddish |

In addition, the coating with $TiO_2$ can result in more intense colours.

b) If Desired, an $SiO_2$ Layer can be Applied to the Pigments Obtained in that Manner:

For that purpose, the pH of the suspension is increased to 7.5 using NaOH solution and, over the course of 90 minutes, a soda waterglass solution (125 g of $SiO_2$/l) is metered in at 75° C. The pH is kept constant using 10% hydrochloric acid. After addition is complete, stirring at 75° C. is subsequently carried out for 30 minutes in order to complete the precipitation.

EXAMPLE 5

Lipstick base having the following composition:

| Number | Substance | Amount [%] |
|--------|-----------|------------|
| 1 | cera alba | 11.4 |
| 2 | candelilla wax | 8.1 |
| 3 | carnauba wax | 3.8 |
| 4 | Lunacera M | 6.0 |
| 5 | castor oil | 38.8 |
| 6 | Controx KS | 0.1 |
| 7 | aroma oil | 1.0 |
| 8 | Amerlate P | 2.5 |
| 9 | OH Ian | 1.6 |
| 10 | isopropyl palmitate | 10.1 |
| 11 | Dow Corning 556 | 2.8 |
| 12 | Dow Corning 1401 | 3.3 |

-continued

| Number | Substance | Amount [%] |
|--------|-----------|------------|
| 13 | $TiO_2$ pigment | 2.3 |
| 14 | pigment according to Example 4a | 8.2 |
| | Total | 100.0 |

Substances 8-10 are mixed together, and substances 13 and 14 are dispersed in the resulting mixture. The resulting paste is then passed several times through a three-roll apparatus. In the meantime, substances 1-6 are melted, stirred together until homogenous, and then substances 7, 11 and 12 are stirred in. The two mixtures are then mixed together in the hot state until homogeneous distribution is achieved. The hot mass is then poured into a lipstick mould and allowed to cool. Lipsticks having an intense colour of outstanding light fastness and very good gloss, and exhibiting no bleeding, are obtained.

What is claimed is:

1. A method of producing plane-parallel structures of $SiO_y$, wherein $0.95 \leq y \leq 1.8$, comprising the steps:
    a) vapour-deposition of a separating agent onto a movable carrier to produce a separating agent layer,
    b) vapour-deposition of an $SiO_y$ layer onto the separating agent layer,
    c) dissolution of the separating agent layer in a solvent,
    d) separation of the $SiO_y$ from the solvent, in which method the $SiO_y$ layer in step b) is vapour-deposited from a vaporiser containing a charge comprising a mixture of Si and $SiO_2$, $SiO_y$ or a mixture thereof, the weight ratio of Si to $SiO_2$ being in the range from 0.15:1 to 0.75:1, and step c) being carried out at a pressure that is higher than the pressure in steps a) and b) and lower than atmospheric pressure.

2. A method according to claim 1, wherein the $SiO_y$ layer in step b) is formed from silicon monoxide vapour produced in the vaporiser by reaction of a mixture of Si and $SiO_2$ at a temperature of more than 1300° C.

3. A method according to claim 1, wherein the vapour-deposition in steps a) and b) is carried out under a vacuum of <0.5 Pa.

4. Plane-parallel structures of $SiO_y$, wherein $0.95 \leq y \leq 1.8$, obtained according to the method of claim 1.

5. Plane-parallel structures of $SiO_y$ according to claim 4, wherein $1.1 \leq y \leq 1.8$.

6. Plane-parallel structures of $SiO_y$, wherein $1 \leq y \leq 5\ 1.8$, the particles of which have a length of from 2 µm to 5 mm, a width of from 2 µm to 2 mm, and a thickness of from 20 nm to 2 µm, and a ratio of length to thickness of at least 2:1, the core of $SiO_y$ having two substantially parallel faces, the distance between which is the shortest axis of the core.

7. Plane-parallel structures of $SiO_y$ according to claim 6, wherein $1.1 \leq y \leq 1.8$.

8. Plane-parallel structures according to claim 4, wherein the ratio of the thickness to the surface area of the plane-parallel structures is less than 0.01 µm$^{-1}$.

9. A method of producing plane-parallel structures of silicon dioxide, comprising steps a) to d) as defined in claim 1 and also the further step:
    e) oxidation of the plane-parallel structures of $SiO_y$ separated off according to step d), using an oxygen-containing gas, for example air, at a temperature of at least 200° C. to 1000° C.

10. A method according to claim 9, further comprising step f) after step e):

f) carrying out dipping, spraying or vapour treatment of the plane-parallel structures of silicon dioxide with at least one organic silane compound and/or at least one fluorine-containing organic compound in order to obtain coupling properties with respect to other organic compounds or for the purpose of producing hydrophilic, hydrophobic or antistatic surfaces.

11. Plane-parallel structures of silicon dioxide, obtained according to claim 9.

12. A method of carburising plane-parallel structures of $SiO_y$, comprising steps a) to d) as defined in claim 1 and also the further step:

g) reaction of the plane-parallel structures of $SiO_y$, separated off according to step d), with a carbon-containing gas selected from alkynes, for example acetylene, alkanes, for example methane, alkenes, aromatic compounds and mixtures thereof, at from 500 to 1500° C.

13. A method according to claim 12, wherein the carburisation is carried out with exclusion of oxygen.

14. A method according to claim 12, which further comprises step h) after step g):

h) oxidisation of the residual amount of $SiO_y$ of the plane-parallel structures carburised according to step g), using an oxygen-containing gas, for example air, at a temperature of at least about 200° C. up to a maximum of about 400° C.

15. A plane-parallel pigment obtained by the method according to claim 12.

16. A plane-parallel pigment based on plane-parallel $SiO_z$ substrates, which comprises, on the surface of the $SiO_z$ substrates, a layer comprising silicon carbide (SiC), wherein $0.95 \leq z \leq 2$.

17. A method for increasing the resistance to abrasion and resistance to impact of a surface coating or dispersion layer which method comprises adding at least one plane-parallel structure according to claim 4 to the surface of such a surface coating or dispersion.

18. A pigment according to claim 16, comprising a further layer of a dielectric material having a refractive index greater than about 1.65.

19. A pigment according to claim 18, wherein the dielectric material is selected from the group consisting of zinc sulfide (ZnS), zinc oxide (ZnO), zirconium oxide ($ZrO_2$), titanium dioxide ($TiO_2$), carbon, indium oxide ($In_2O_3$), indium tin oxide (ITO), tantalum pentoxide ($Ta_2O_5$), cerium oxide ($CeO_2$), yttrium oxide ($Y_2O_3$), europium oxide ($Eu_2O_3$), iron oxides such as iron(II)/iron(III) oxide ($Fe_3O_4$) and iron(III) oxide ($Fe_2O_3$), hafnium nitride (HfN), hafnium carbide (HfC), hafnium oxide ($HfO_2$), lanthanum oxide ($La_2O_3$), magnesium oxide (MgO), neodymium oxide ($Nd_2O_3$), praseodymium oxide ($Pr_6O_{11}$), samarium oxide ($Sm_2O_3$), antimony trioxide (Sb2O3), silicon monoxides (SiO), selenium trioxide ($Se_2O_3$), tin oxide ($SnO_2$), tungsten trioxide ($WO_3$) and combinations thereof, an iron titanate, an iron oxide hydrate, a titanium suboxide and a mixture or mixed phase of those compounds.

20. A composition comprising a high molecular weight organic material and from 0.01 to 80% by weight, based on the high molecular weight organic material, of a pigment according to claim 16.

21. A cosmetic preparation or formulation comprising from 0.0001 to 90% by weight of a pigment according to claim 16 and from 10 to 99.9999% of a cosmetically suitable carrier material, based on the total weight of the cosmetic preparation or formulation.

22. An ink-jet printing, textile, surface coating, printing ink, plastic, cosmetic, glaze for ceramics or glass composition which comprises a pigment according to claim 16.

23. A plane-parallel pigment based on plane-parallel $SiO_z$ substrates, which comprises, on the surface of the $SiO_z$ substrates, a layer comprising silicon carbide (SiC) and silicon nitride ($Si_3N_4$), wherein $0.95 \leq z \leq 2$.

24. A plane-parallel pigment based on plane-parallel $SiO_z$ substrates, which comprises, on the surface of the $SiO_z$ substrates, a layer comprising silicon nitride ($Si_3N_4$, wherein $0.95 \leq z \leq 2$.

25. A plane-parallel pigment comprising at least one $SiO_z$ layer, which comprises, a top surface and side surfaces of the $SiO_z$ layer, which comprises on said top and side surfaces a layer comprising silicon carbide (SiC), wherein $0.95 \leq z \leq 2$.

26. Plane-parallel structures according to claim 6 wherein the ratio of the thickness to the surface area of the plane-parallel structures is less than $0.01\ \mu m^{-1}$.

27. Plane-parallel structures of silicon dioxide, obtained claim 9, having a thickness in the range from 20 to 2000 nm.

28. A plane-parallel pigment obtained by the method according to claim 12, having a thickness in the range from 20 to 2000 nm.

29. A plane-parallel pigment obtained by the method according to claim 14.

30. A plane-parallel pigment obtained by the method according to claim 14, having a thickness in the range from 20 to 2000 nm.

31. A method for increasing the resistance to abrasion and resistance to impact of a surface coating or dispersion layer which method comprises adding at least one plane-parallel structure according to claim 6 to the surface of such a surface coating or dispersion.

32. A method for increasing the resistance to abrasion and resistance to impact of a surface coating or dispersion layer which method comprises adding at least one plane-parallel structure according to claim 11 to the surface of such a surface coating or dispersion.

33. A corrosion-resistant coating composition, selectively reflecting in the infra-red, which comprises at least one of the carburised plane-parallel structures according to claim 15.

34. A corrosion-resistant coating composition, selectively reflecting in the infra-red, which comprises at least one of the carburised plane-parallel structures according to claim 16.

35. A method for pigmenting an ink-jet printing, textile, surface coating, printing ink, plastic, cosmetic or glazing for ceramics and glass composition which comprises adding thereto a pigment according to claim 16.

36. Plane-parallel structures of $SiO_y$, according to claim 5 wherein $1.4 \leq y \leq 1.8$.

37. Plane-parallel structures of $SiO_y$, according to claim 7 wherein $1.4 \leq y \leq 1.8$.

* * * * *